United States Patent [19]
Fudeyasu et al.

[11] Patent Number: 5,566,124
[45] Date of Patent: Oct. 15, 1996

[54] SEMICONDUCTOR MEMORY DEVICE CAPABLE OF READING REQUIRED DATA SIGNAL AT DESIGNATED ADDRESS INTERVAL AND METHOD OF OPERATION THEREOF

[75] Inventors: Yoshio Fudeyasu; Junko Ito, both of Hyogo-ken, Japan

[73] Assignee: Mitsubishi Denki Kabushiki Kaisha, Tokyo, Japan

[21] Appl. No.: 141,716

[22] Filed: Oct. 27, 1993

Related U.S. Application Data

[63] Continuation of Ser. No. 651,865, Feb. 7, 1991, abandoned.

[30] Foreign Application Priority Data

Feb. 13, 1990 [JP] Japan ....................................... 2-32791

[51] Int. Cl.[6] ...................................................... G11C 8/04
[52] U.S. Cl. ................... 365/230.06; 365/189.12; 365/221; 365/230.05; 365/230.08; 365/230.09; 365/236; 365/239; 365/240
[58] Field of Search ...................................... 395/166, 400, 395/425; 365/189.12, 221, 230.05, 230.08, 230.09, 236, 239, 240, 230.06

[56] References Cited

U.S. PATENT DOCUMENTS

| 4,633,441 | 12/1986 | Ishimoto | 365/230.05 |
| 4,667,313 | 5/1987 | Pinkham et al. | 365/240 |
| 4,727,481 | 2/1988 | Aguille et al. | 395/400 |
| 4,757,473 | 7/1988 | Kurihara et al. | 365/240 |

FOREIGN PATENT DOCUMENTS 3260995  11/1991  Japan ..................................... 365/236

Primary Examiner—Jack A. Lane
Attorney, Agent, or Firm—Lowe, Price, LeBlanc & Becker

[57] ABSTRACT

An improved video RAM (1) is disclosed which is capable of reading at a high speed a data signal necessary for image processing. The data signal stored in a row of memory cells designated by a row decoder (13) is held in a serial register (4). A mode decoder (8) is responsive to externally provided interval data to control a counter (7) such that the counter (7) generates internal addresses SY0 to SY7 incrementing at the designated intervals. A serial decoder (6) is responsive to the internal addresses SY0 to SY7 to designate the serial register (4) at the designated intervals. Accordingly, only required data is provided from the serial register (4), with the result that desired data can be provided in a short period of time.

16 Claims, 14 Drawing Sheets

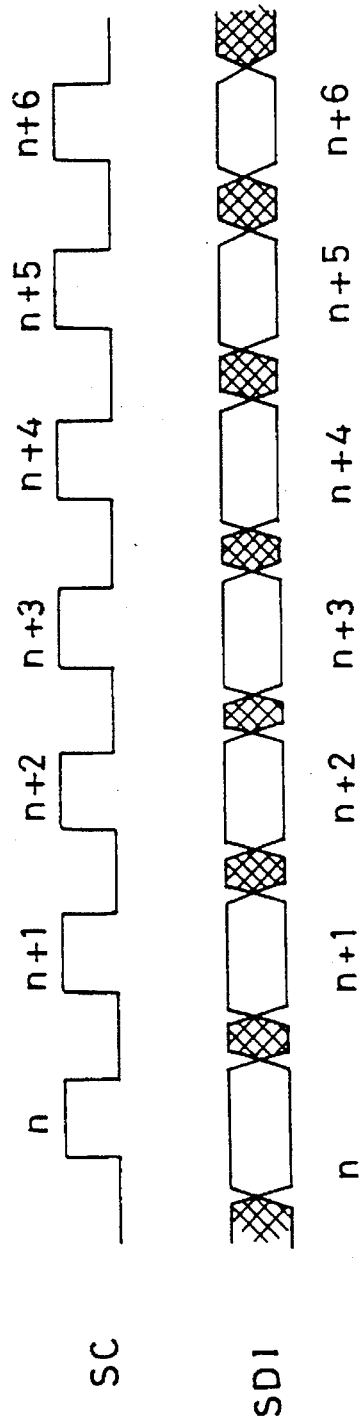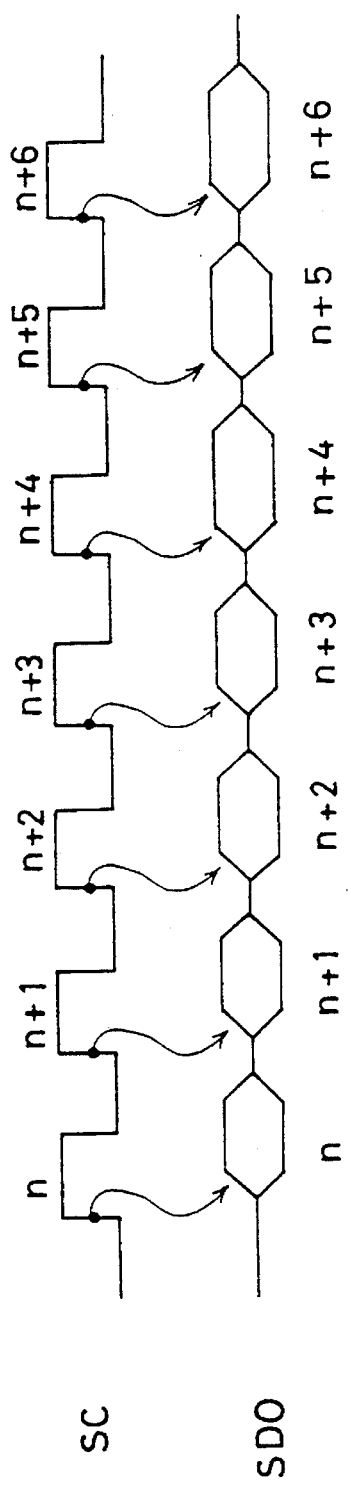
FIG.12A PRIOR ART
FIG.12B PRIOR ART

SEMICONDUCTOR MEMORY DEVICE CAPABLE OF READING REQUIRED DATA SIGNAL AT DESIGNATED ADDRESS INTERVAL AND METHOD OF OPERATION THEREOF

This application is a continuation of application Ser. No. 07/651,865 filed Feb. 7, 1991 now abandoned.

BACKGROUND OF THE INVENTION

1. Field of the Invention

The present invention generally relates to a semiconductor memory device and, more particularly, to a semiconductor memory device for outputting at a high speed a stored data signal at an externally designated interval. The present invention has a particular applicability to a video RAM and a field memory for image processing.

2. Description of the Background Art

With the recent development of image processing technology, the development of technology has been rapidly progressing for e.g. color display on cathode ray tube of personal computers, three dimensional display of CAD system, enlargement and reduction of images, multi-windowing of the screen, and enhancement of resolution. In addition, computer graphics for displaying the result of numerical calculation by super computers and the like have also been noted. Under such circumstances, various video memory devices have been developed for storing a digital image signal. A video RAM is known as a random access memory optimized for storing image data and is capable of performing random access and serial access.

FIG. 10A is a block diagram showing an overview of a video RAM. The video RAM 1' comprises a dynamic random access memory cell array 2 for storing image data, a data transfer bus 102 for transferring the data read from the memory cell array 2, and a serial register 4 for serial access. The memory cell array 2 is connected to a central processing unit (CPU) 201 through a random access port, and is random accessed by CPU 201. The serial register 4 for serial access serially outputs image data read through the data transfer bus 102 through a serial access port responsive to an externally provided serial clock signal SC. The outputted serial data is applied to a CRT controller 202. The CRT controller 202 includes a latch circuit 206 for latching the output serial data. The data latched to the latch circuit 206 is converted into an analog signal by a D/A converter 207. An RGB processor 208 responds to the converted analog signal and generates R, G and B signals for display on a CRT display 203 by image processing. The R, G and B signals are applied to the CRT display 203. The CRT controller 202 also includes synchronizing control circuit 209 for performing synchronizing control of the CRT display 203 in response to a synchronizing control signal generated from a circuit 209, and display an image according to the R, G and B signals. It is pointed out that in the above mentioned operation, the CPU 201 generates a various kinds of control signals for controlling the video RAM 100 and the CRT controller 202.

Also in the field of image technology, such as recent television and video tape recorder (VTR), there has been a greater demand for digital signal processing for image signal. More specifically, digital television, digital video tape recorder and the like are being developed. In these equipments, enhancement of image quality and multifunction of image are realized by digital processing of image signal. Under the circumstances, a field memory has already been developed which stores the image data to be displayed on the whole screen.

FIG. 10B is a schematic diagram showing an overview of a field memory. Referring to FIG. 10B, the field memory 300 comprises a serial input register 301 for receiving serial data, a field memory cell array 303 for storing the data to be displayed on the whole screen, a serial output register 305 for holding the output data, and data transfer buses 302 and 304. The serial input register 301 receives the data provided from an A/D converter 204 through a serial input port in response to a clock signal SC1. The serial output register 305 applies the data read from the memory cell array 303 to a D/A converter 205 through a serial output port in response to the clock signal SC2. As described above, a video RAM generally has two input/output portions, namely, a random access port and a serial access port, whereas a field memory generally has a serial input port and a serial output port. It is pointed out that these two memory devices have a common point in that they both serially output the data read from the memory cell array in response to an externally provided serial clock. Since serial outputting of the read data is performed in response to one serial clock signal, the data for displaying a picture or an image is obtained at a high speed. Although the invention is generally applicable to a video RAM and a field memory, for the purpose of simplification, only the application to a conventional video RAM will be described below.

FIG. 11A is a block diagram of a conventional video RAM. The video RAM is seen in U.S. Pat. No. 4,633,441. It is assumed that the video RAM 1' has memory cells MC arranged in 256 rows×256 columns. Referring to FIG. 11A, the video RAM 1' comprises a memory cell array 2, a row address buffer 11 and a column address buffer 12. A row decoder 13 is responsive to row address signals AX0 to AX7 for designating a word line WL, and a column decoder 14 is responsive to column address signals AY0 to AY7 for selecting a bit line pair. A sense amplifier 3 amplifies the data signal read from the designated memory cell. A serial register 4 holds the amplified data signal. A counter 7' generates internal address signals SY0 to SY7 for serial output based on start addresses SA0 to SA7 applied from the column address buffer 12. A serial decoder 6 is responsive to the generated internal address signal for designating stages of the serial register 4. A random access port is connected to a data bus line 15. More specifically, a parallel data input PDI and a parallel data output PD0 are connected to the data bus line 15, while serial access port, namely, a serial data input SDI and a serial data output SDO, is connected to a serial bus line 5.

A clock signal generating circuit 16' is connected to receive a row address strobe signal $\overline{RAS}$, a column address strobe signal $\overline{CAS}$, a serial clock signal SC and a data transfer signal $\overline{DT}$. The clock signal generating circuit 16' generates the required control clock signal in response to the externally provided signals.

In operation, the memory cell designated by the address signals AX and AY is accessed through the random access port, namely, the parallel data input PDI and the parallel data output PDO. Meanwhile, serial data is inputted and outputted through the serial access port, namely, the serial data input SDI and the serial data output SDO in response to the internal address signal generated by the counter 7'. The serial register 4 includes 256 register devices. In serial output operation, the row decoder 13 selects one externally designated word line, and digital signals stored in memory cells connected to the word line are therefore amplified by the sense amplifier 3. The counter 7' responds to a serial clock signal SC generated from the clock signal generating circuit 16', and generates sequentially increasing internal address signals SY0~SY7. The serial decoder 6 responds to the internal address signals SY0~SY7, and selects register devices in the serial register sequentially so that the data signals held in the respective register devices are read out.

FIG. 11B is a block diagram of the counter 7' shown in FIG. 11A. Referring to FIG. 11B, the counter 7' includes 8 cascaded count units 700~707. Each of the counter units 700~707 is connected to receive a serial clock signal SC. The counter units 700~707 are initialized according to initiation addresses SA0~SA7 applied through the column address buffer 12, and then generates sequentially increasing internal address signals SY0~SY7, in response to the serial clock signal SC. The internal address signals SY0~SY7 are applied to the serial decoder 6.

FIGS. 12A and 12B are timing charts showing the serial input and the serial output of data. The serial access functionis realized in response to the externally provided serial clock signal SC. More specifically, in the case of serial data input, as shown in FIG. 12A, an internal address signal is counted up in response to the rise of a serial clock signal SC and the data signal SDI externally provided in response to the internal address signal is inputted to the video RAM. Similarly, in the case of serial output, as shown in FIG. 12B, an internal address signal is incremented in response to the rise of a serial clock signal SC. The data SDO designated by the internal address generated by the counter 7' is serially outputted.

Referring to the timing chart shown in FIG. 13, the serial output operation of the video RAM shown in FIG. 11A will be described in more detail. First, after a column address ADx is applied in response to the fall of the signal $\overline{RAS}$, a column address ADy is applied in response to the fall of the signal $\overline{CAS}$. The column address buffer 12 shown in FIG. 11 applies the column address ADy to the counter section 7' as start addresses (SA0 to SA7). The counter 7' starts counting from the applied start address ADy. Accordingly, the counter 7' generates an internal address signal starting from the start signal ADy in response to the clock signal SC. The serial decoder 6 sequentially designates the registers provided in the serial register 4 in response to the generated internal address signal.

Each register in the serial register 4 holds the data signal read by the sense amplifying 3 from the memory cell in the memory cell array 2. Since each register in the serial register 4 is sequentially designated by the serial decoder 6, serial data are outputted at a high speed. More specifically, as shown in FIG. 13, the data D0, D1, D2, . . . are outputted designated by the incrementing addresses ADY, AD (y+1), AD (y+2), . . . , being incremented from the applied start address ADy (where the address ADx is constant).

In the field of the conventional image processing, in order to carry out, for example, reduction of image and the mosaic forming of images, it is necessary to selectively sample the data at a predetermined address interval from a set of data (e.g. 1 frame of data) for configuring one image. More specifically, the reduced or mosaic formed picture is displayed on a screen based on the picture data selectively sampled. Conventionally, after all of one set of the data was read from the video RAM, the desired data was sampled from the read data by software processing.

FIG. 14 is a timing chart showing successive data being read from the video RAM shown in FIG. 11. More specifically, as shown in FIG. 14, first all one set of data for configuring one image is read irrespective of being used or not. Accordingly, although the data D0 to D9 are read successively in response to the serial clock SC, only the data D0, D4 and D8 are required among these data in order to configure the reduced image or picture for the mosaic formed image. That is, only the data D0, D4, and D8 are used, and other data are not used. The sampling of these data D0, D4 and D8 to be used is performed by software processing, for example, in the cathode ray tube controller 202 shown in FIG. 9.

Thus, since one set of data is all serially read from the video RAM 1' shown in FIG. 11 irrespective of necessity, it takes longer than required to read the data. For instance, in the example shown in FIG. 14, it takes 9 clock cycles to obtain the required 3 data, D0, D4, and D8, so that it requires the period T1.

SUMMARY OF THE INVENTION

One object of the present invention is to serially output at a higher speed a desired data signal stored in a semiconductor memory device.

Another object of the present invention is to serially output only required ones out of data signals stored in a semiconductor memory device.

A further object of the present invention is to provide an image processing memory device having a reading speed required in image processing.

Briefly stated, a semiconductor memory device in accordance with the present invention comprises a memory cell array (2) including a plurality of memory cells (MC) arranged in rows and columns for storing the data signal; address generating circuitry responsive to an externally provided clock signal for generating an internal address signal for designating, in succession, a monotonic series of memory cells including non-successive memory cells provided on a given row; a serial data bus; and reading circuitry responsive to the internal address signal generated by the address generating circuitry for reading the data signal stored in said series of memory cells to be transferred to the serial data bus.

In another aspect, a semiconductor memory device in accordance with the present invention comprises a memory cell array including a plurality of memory cells arranged in rows and columns for storing a data signal, an address generating circuit responsive to an externally provided clock signal for generating an internal address signal for designating in succession the memory cells provided on a given row, a reading circuit responsive to the internal address signal generated by the address generating circuit for reading the data signal stored in the designated memory cells, and an interval controlling circuit responsive to an externally provided internal designating signal for controlling the interval of the address values generated by the address generating circuit.

In operation, the interval controlling circuit is responsive to the externally provided interval designating signal to control the interval of the address values generated by the address generating circuit. Accordingly, the address generating circuit generates the internal address signal at the intervals of the designated address values. As a result, the reading circuit reads only the required data signal from the memory cells designated by the generated internal address signal and a period of time necessary for reading is shortened.

A semiconductor memory device in accordance with the present invention, in another aspect, further comprises a memory cell array including a plurality of memory cells arranged in rows and columns for storing a data signal, and a serial output data bus. The memory device includes the following steps of generating an internal address signal designating, in succession, a monotonic series of memory cells of the array including non-excessive memory cells provided on a given row, reading the data signal stored in the series of memory cells designated by the address signal, and transferring the data signal read from the series of memory cells to the serial output bus.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 12A and 12B show timing charts for explaining a serial input and a serial output of data.

DESCRIPTION OF THE PREFERRED EMBODIMENTS

Figure 1:
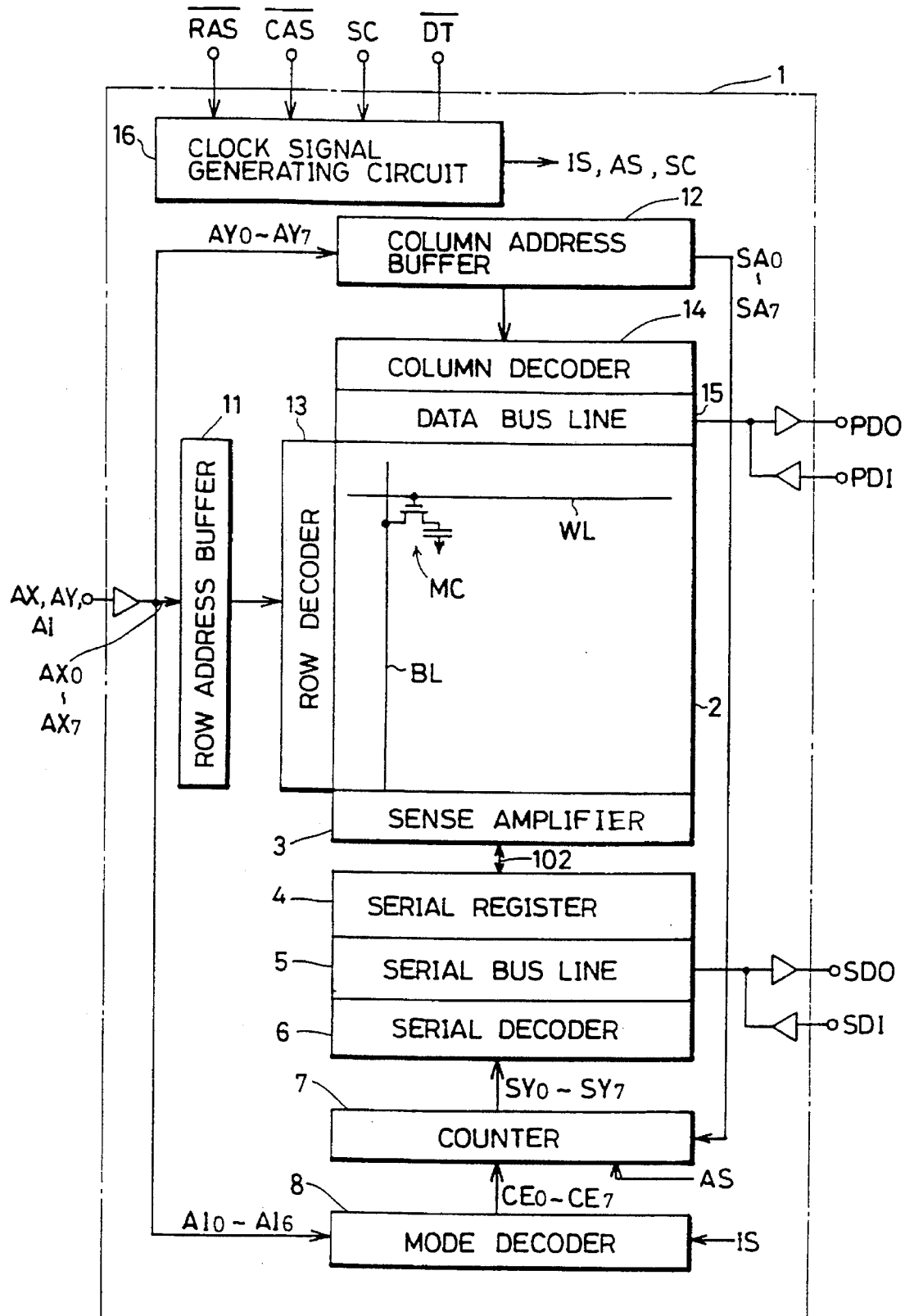
FIG. 1 is a block diagram of a video RAM in accordance with one embodiment of the present invention.
Figure 11A:
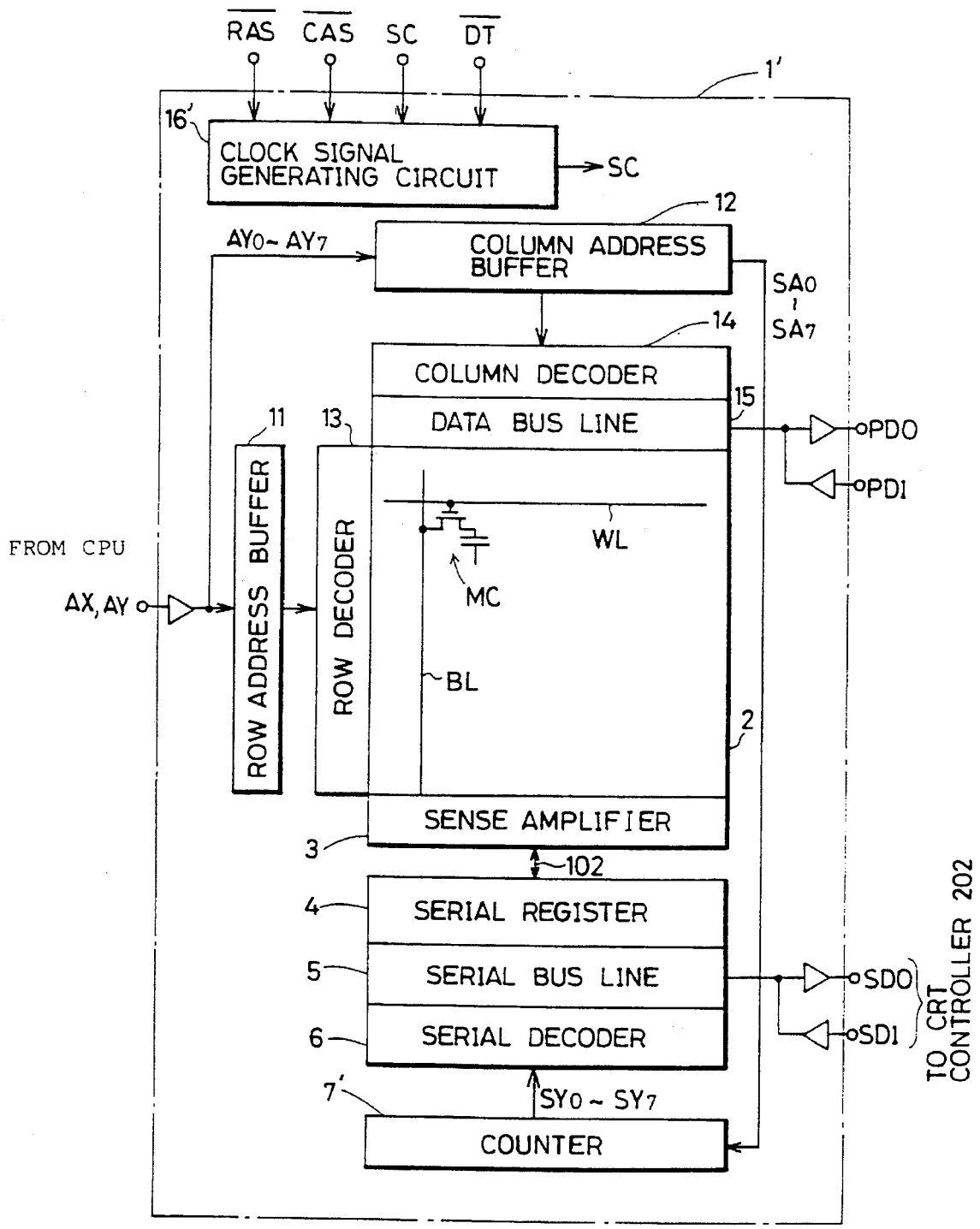
FIG. 11A is a block diagram of a conventional video RAM.
Figure 11B:
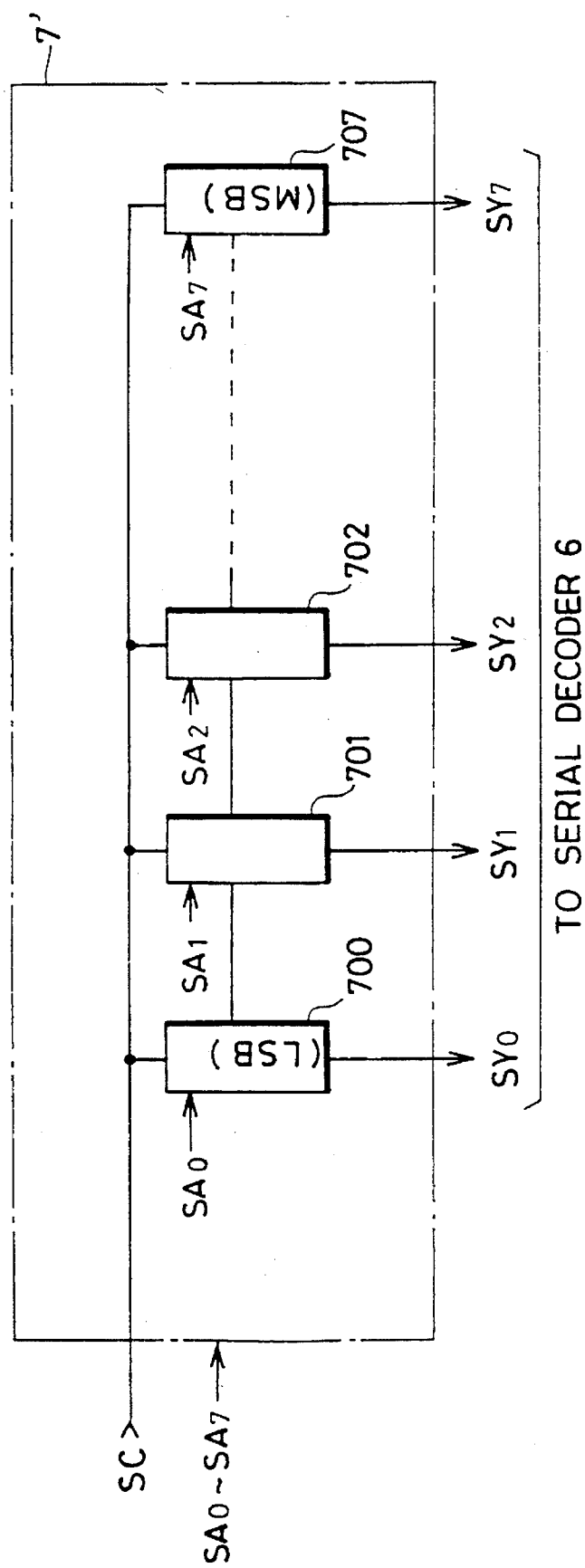
FIG. 11B is a block diagram of the counter 7' shown in FIG. 11A.

Referring to FIG. 1, a video RAM 1 shown is additionally provided with a mode decoder 8 for controlling the counter 7, as compared with the conventional video RAM 1' shown in FIG. 11A. The counter 7 includes a modification made in accord with the addition of the mode decoder 8. The clock signal generating circuit 16 also includes a modification made to generate control clocks MI and AI for use in the mode decoder 8 and the counter 7. Other circuits are substantially the same as those in the conventional video RAM 1' shown in FIG. 11A and a description thereof is omitted. It is pointed out that in the video RAM 1, the interval of increase in the internal address indicated by internal address signals SY0~SY7 generated from the counter 7 can be externally controlled. That is, the additionally provided mode decoder 8 decodes an externally applied address interval data AI, and the counter 7 responds to the decoded signals CE0~CE7 and generates the internal address signals SY0~SY7 which increase at a designated interval. It is pointed out that in the conventional counter 7' shown in FIGS. 11A and 11B, the address increase interval was not able to be controlled.

Figure 2:
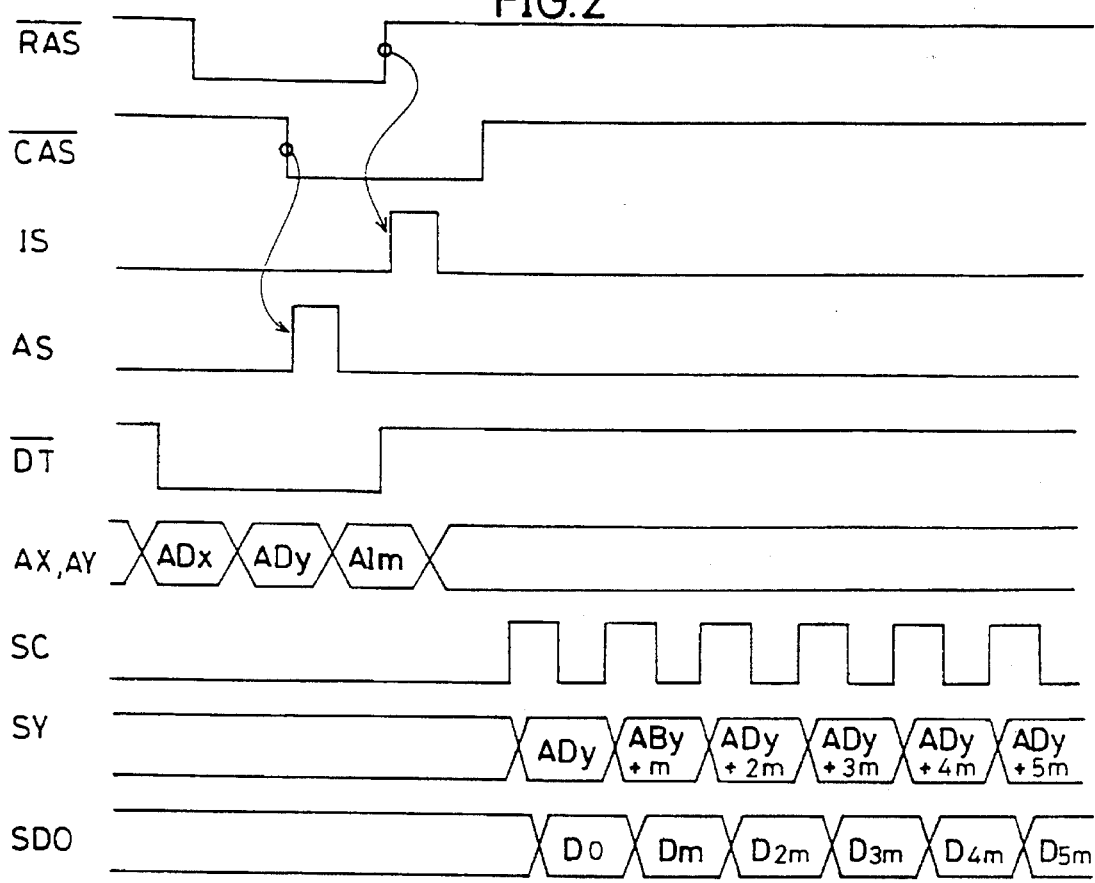
FIG. 2 is a timing chart for explaining an operation of the video RAM shown in FIG. 1.
Figure 13:
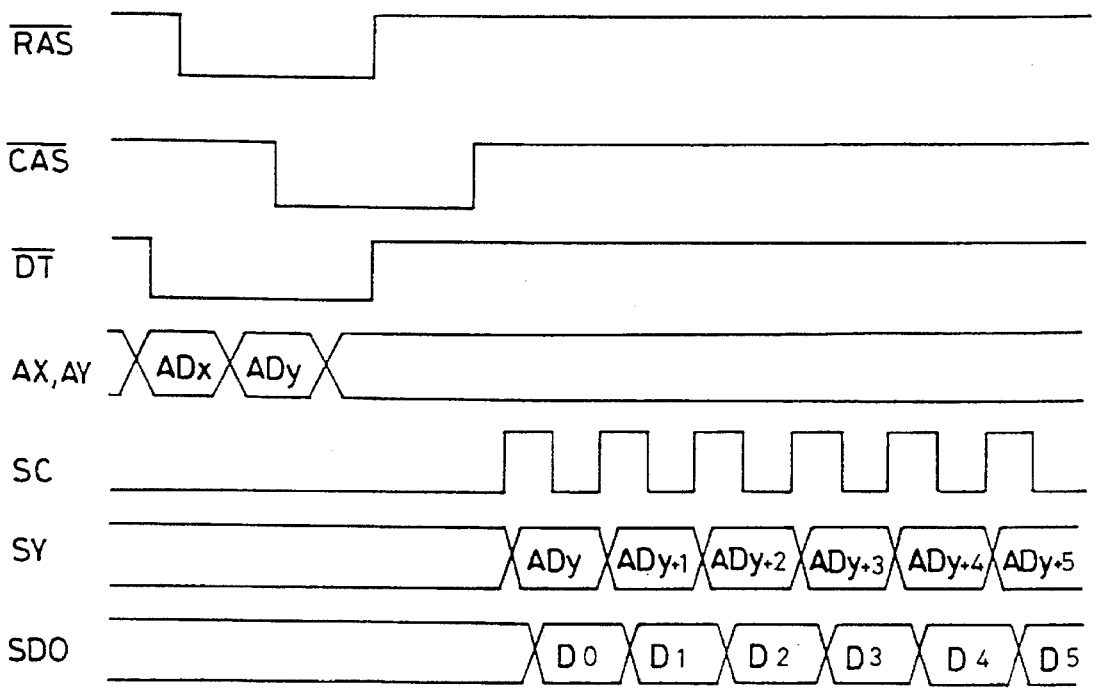
FIG. 13 is a timing chart for explaining an operation of the video RAM shown in FIG. 11.

Referring to FIG. 2, an operation of the video RAM shown in FIG. 1 will be described. When a reading operation is to be started, a row address AX, a column address AY and address interval data AI are externally provided. The row address AX is held in the row address buffer 11 in response to the fall of the signal $\overline{RAS}$. The column address AY is held in the column address buffer 12 in response to the fall of the signal $\overline{CAS}$. The address interval data AI is held in the mode decoder 8 in response to the interval setting signal IS generated from the clock signal generating circuit 16 in response to the rise of the signal $\overline{RAS}$. The column address buffer 12 supplies the counter 7 with the start address ADy (SA7) for serial outputting. The mode decoder 8 decodes the applied address interval data AIm to provide signals CE0 to CE7 for enabling counters provided in the counter 7. The counter 7 is responsive to the applied signals CE0 to CE7 to determine a counter constituting the least significant bit. As a result, the counter 7 generates internal addresses ADy, ADy+m, ADy+2m, . . . at the interval of every count value. More specifically, the internal address signal SY having the address interval of m is generated by the counter 7. The internal address signal SY having the generated interval m is supplied to the serial register 4.

The serial register 4 has held the serial data read in response to the applied address signal AX. The serial decoder 6 decodes the internal address signals SY0 to SY7 generated by the counter 7 to designate the register in the serial register 4 at the interval m. Accordingly, the data D0, Dm, D2m, . . . read from the memory cells designated by the address values of the interval m is read in series.

Figure 3:
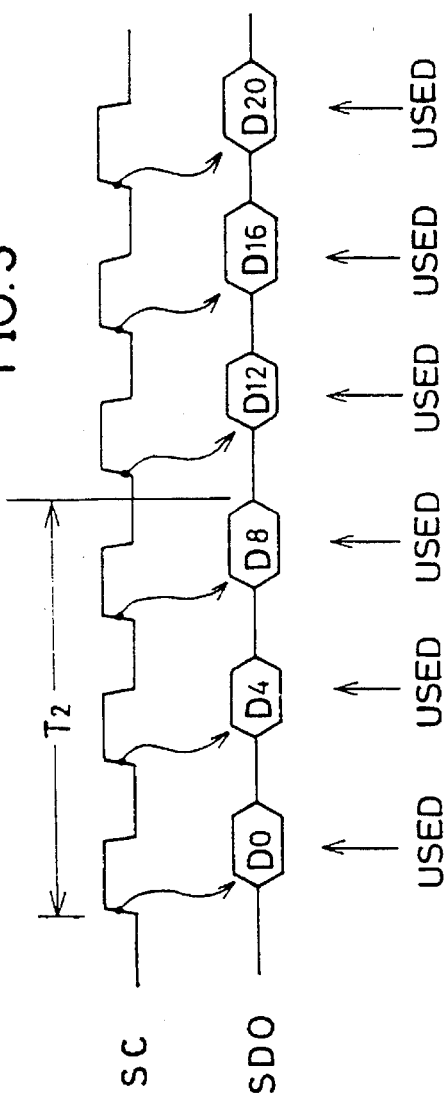
FIG. 3 is a timing chart showing the reading operation of the data in the video RAM shown in FIG. 1.
Figure 14:
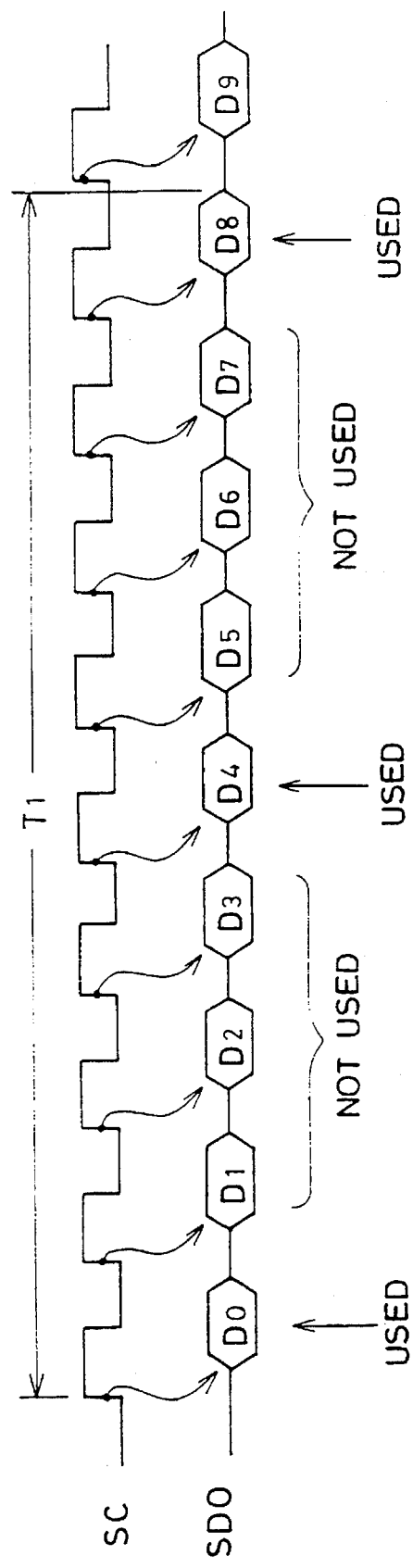
FIG. 14 is a timing chart showing the reading operation of the data from the video RAM shown in FIG. 11.

Accordingly, as shown in FIG. 3, only required data D0, D4, D8, . . . to be used for reduction or mosaic forming of the image is provided from the video RAM1 shown in FIG. 1. In other words, since the data not used is not obtained, any period of time necessary for outputting the same is eliminated. More specifically, in order to obtain the required data D0, D4 and D8, three clock cycles of the serial clock signal SC are required. Accordingly, the period T2 becomes necessary and apparently an unnecessary period of time has been shortened as compared with the necessary period T1 shown in FIG. 14.

Figure 4:
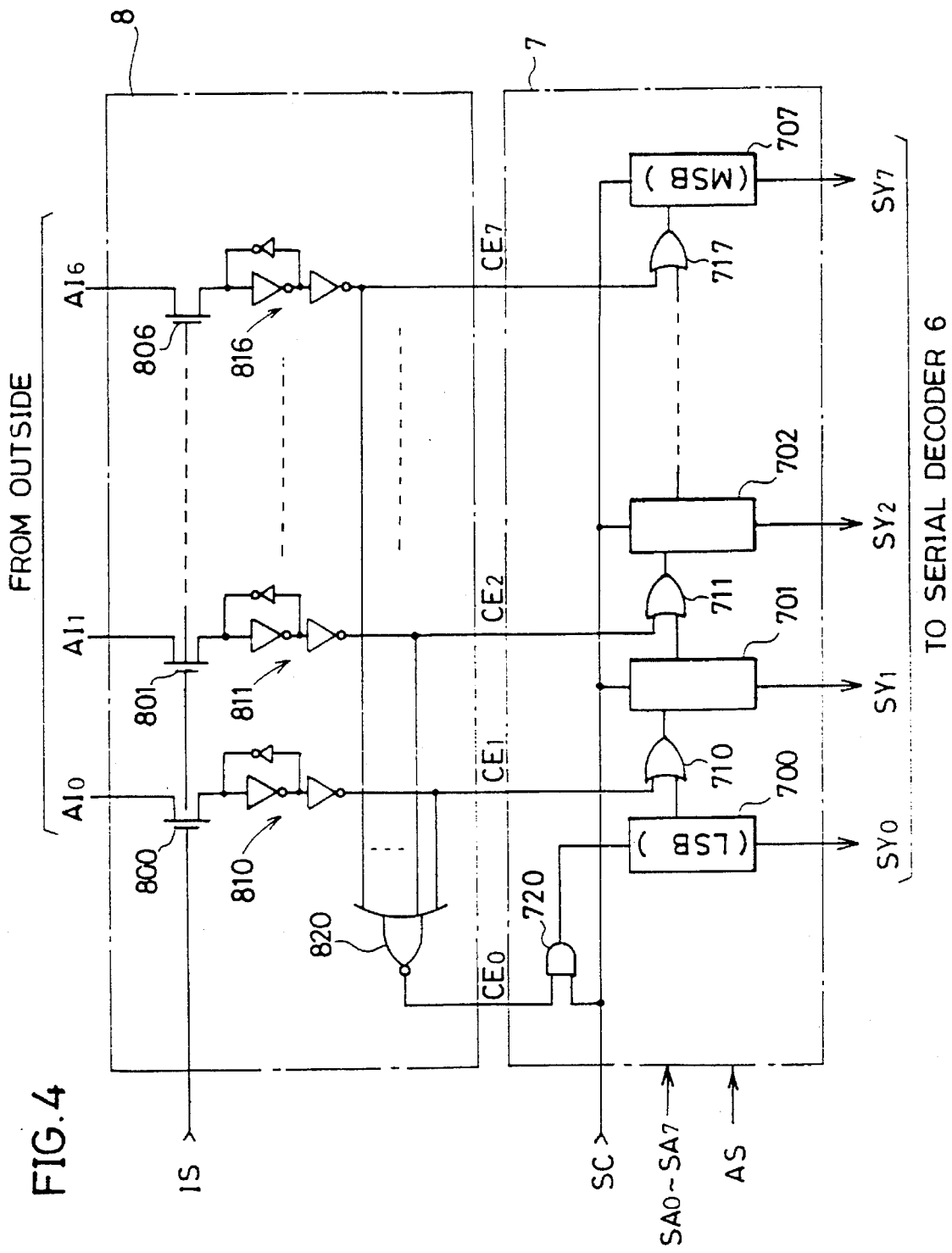
FIG. 4 is a schematic diagram of a counter and a mode decoder shown in FIG. 1.

FIG. 4 is a schematic diagram of the counter 7 and the mode decoder 8 shown in FIG. 1. Referring to FIG. 4, the mode decoder 8 comprises latch circuits 810 to 816 for holding 7-bit address interval data AI to AI6, gate circuits 800 to 806 responsive to the interval setting signal IS to provide address interval data AI0 to AI6 to the latch circuits 810 to 816, and a NOR gate 820 connected to the output from the latch circuits 810 to 816. The NOR gate 820 and the latch circuits 810 to 816 provide signals CE0 to CE7 for determining the least significant bit (LSB) of the internal address generated by the counter 7. The signal IS is generated from the clock signal generating circuit 16 shown in FIG. 1 in response to the rise of the signal $\overline{RAS}$.

The counter 7 comprises eight counter units 700 to 707 cascaded to constitute a 8-bit counter, OR gates 710 to 717 connected between the counter units, and an AND gate 720 for supplying a serial clock signal SC to the counter unit 700 of the least significant bit. The counter unit 707 constitutes the most significant bit of the internal address signal. The respective counter units 700 to 707 provide 8-bit internal address signals SY0 to SY7 to the serial decoder 6 shown in FIG. 7 to be described subsequently.

Now an operation will be described in the following in connection with a case where the address values generated for providing the serial data are incremented at the interval of 2 by way of one example. In such case, the data represented by the following equation is externally provided by way of the address interval data AI.

$$(AI0, AI1, AI2, AI3, AI4, AI5, AI6)=(0, 1, 0, 0, 0, 0, 0) \quad (1)$$

Accordingly, the signal AI1 of the high level is held only in the latch circuit 811 in the mode decoder 8 in response to the interval setting signal IS generated by the clock signal generating circuit 16. As a result, the latch circuit 811 provides the signal CE2 of the high level to the OR gate 711 and the NOR gate 820. Accordingly, the NOR gate 820 provides the low level signal to the AND gate 720. The AND gate 720 provides the low level signal to the counter unit 700 constituting the least significant bit and, therefore, the counter unit 700 comes not to be supplied with the serial clock signal SC. On the other hand, since the counter unit 701 is supplied with the high level signal through the OR gate 710, the same operates in response to the clock signal SC. More specifically, the counter units 701 to 707 constitute a 7-bit counter, so that the increasing more significant 7 bits out of the 8-bit internal address signals SY0 to SY7 are supplied to the serial decoder 6.

Figure 5:
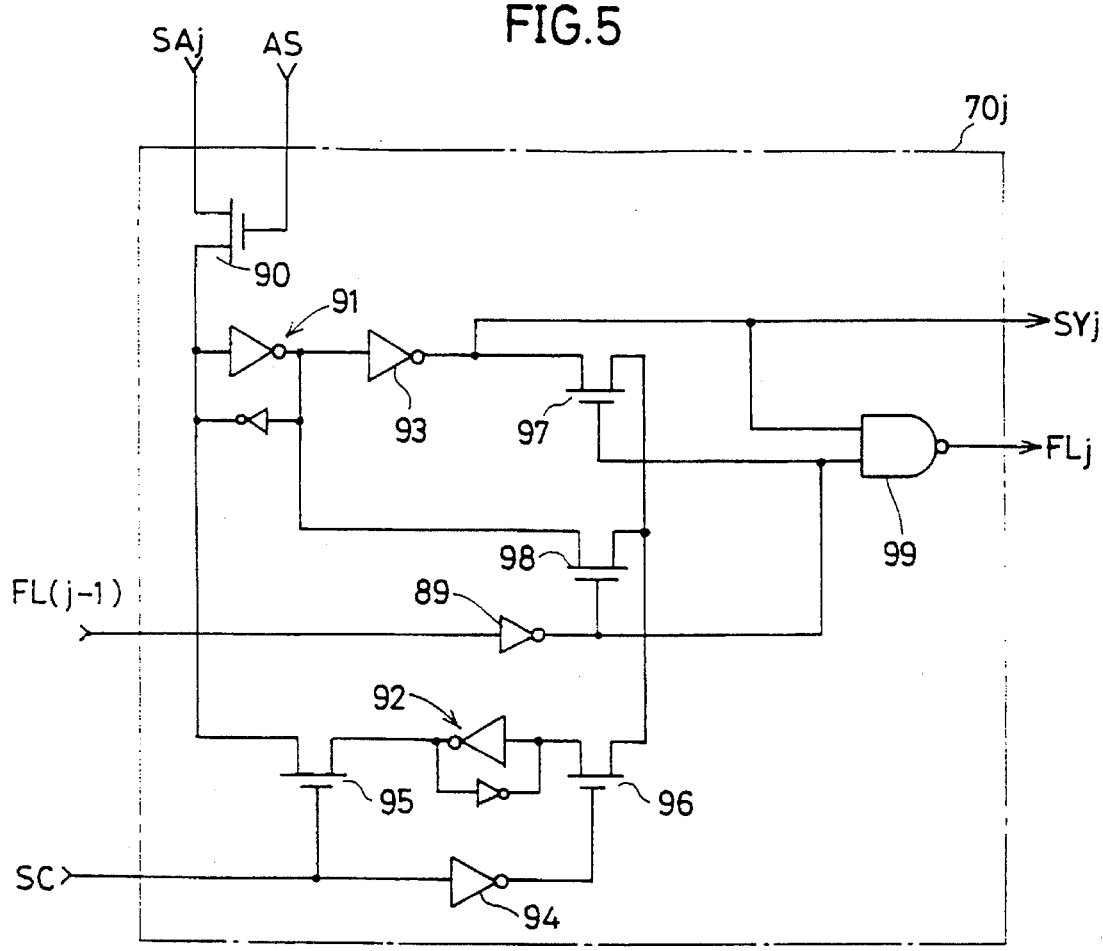
FIG. 5 is a schematic diagram of one counter unit shown in FIG. 4.

FIG. 5 is a schematic diagram of one counter unit shown in FIG. 4. Referring to FIG. 5, the counter unit 70j comprises two latch circuits 91 and 92, NMOS transistors 90, 95, 96, 97 and 98, inverters 89, 93 and 94, and an AND gate 99. One bit SAj of the start address is applied to the latch circuit 91 through the transistor 90. The transistor 90 is responsive to a one shot pulse signal AS generated by the clock signal generating circuit 16 at the timing shown in FIG. 2 to be turned on. The transistors 95 and 96 are responsive to the serial clock signal SC so that either one may be turned on alternately. The NAND gate 99 generates a flag signal FLj showing a carry over to provide the same to a counter unit connected to the next stage. The inverter 89 is connected to receive the flag signal FL (j-1) from the counter unit connected to the preceding stage. The output signal from the inverter 93 is applied to the serial decoder 6 as the bit signal SYj of one of the internal addresses.

Figure 6A:
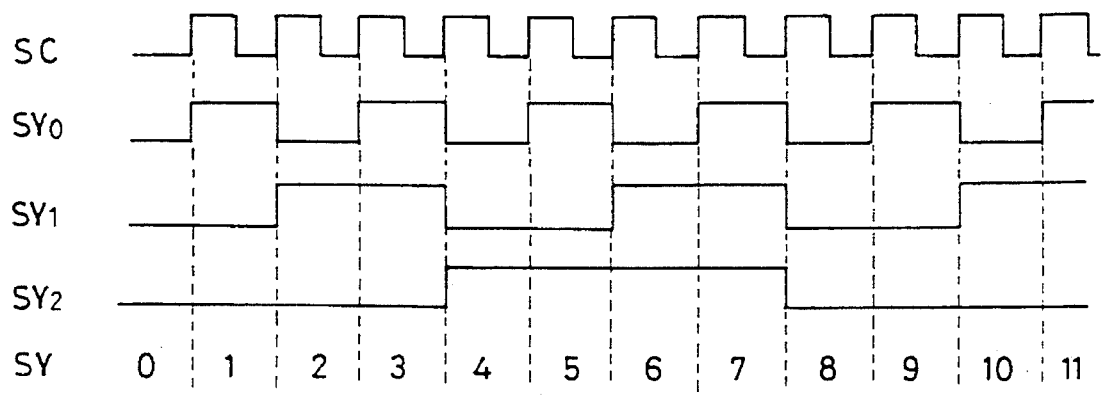
FIGS. 6A and 6B show timing charts showing examples of the operation of the video RAM shown in FIG. 1.
Figure 6B:
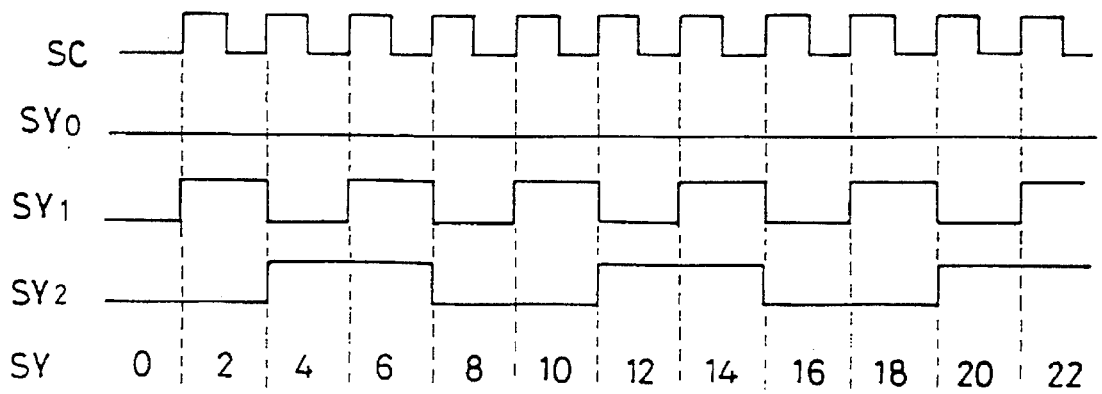

FIGS. 6A and 6B are timing charts showing examples of the operation of the video RAM shown in FIG. 1. FIG. 6 shows the same count operation as that of the conventional circuit, i.e, the case where the internal address signal is incremented for each address. More specifically, in such case the address interval data AI0 to AI6 comprised of a signal of all zero are applied to the mode decoder 8 and, therefore, the counter unit 700 shown in FIG. 4 operates as a counter for the least significant bit. Accordingly, as shown in FIG. 6A, the internal address signal SY0 is driven in response to the serial clock signal SC. As a result, the internal address signal SY being incremented for each address value is obtained and the respective bits SY0 to SY7 are applied to the serial decoder 6.

FIG. 6B shows a case where the internal address signal SY being incremented for at every two address values is generated. In that case, the address shifting data AY0 to AY6 represented by the above described equation (1) is applied to the mode decoder 8 from outside. As previously described, the counter unit 701 shown in FIG. 4 operates as if the same were a counter for the least significant bit. More specifically, as shown in FIG. 6B, the internal address bit SY0 is held at the low level and the internal address bit SY1 is driven in response to the serial clock SC. Accordingly, the internal address signal SY being incremented at the intervals of two address values is obtained and the respective bit signals SY0 to SY7 are applied to the serial decoder 6.

Figure 7:
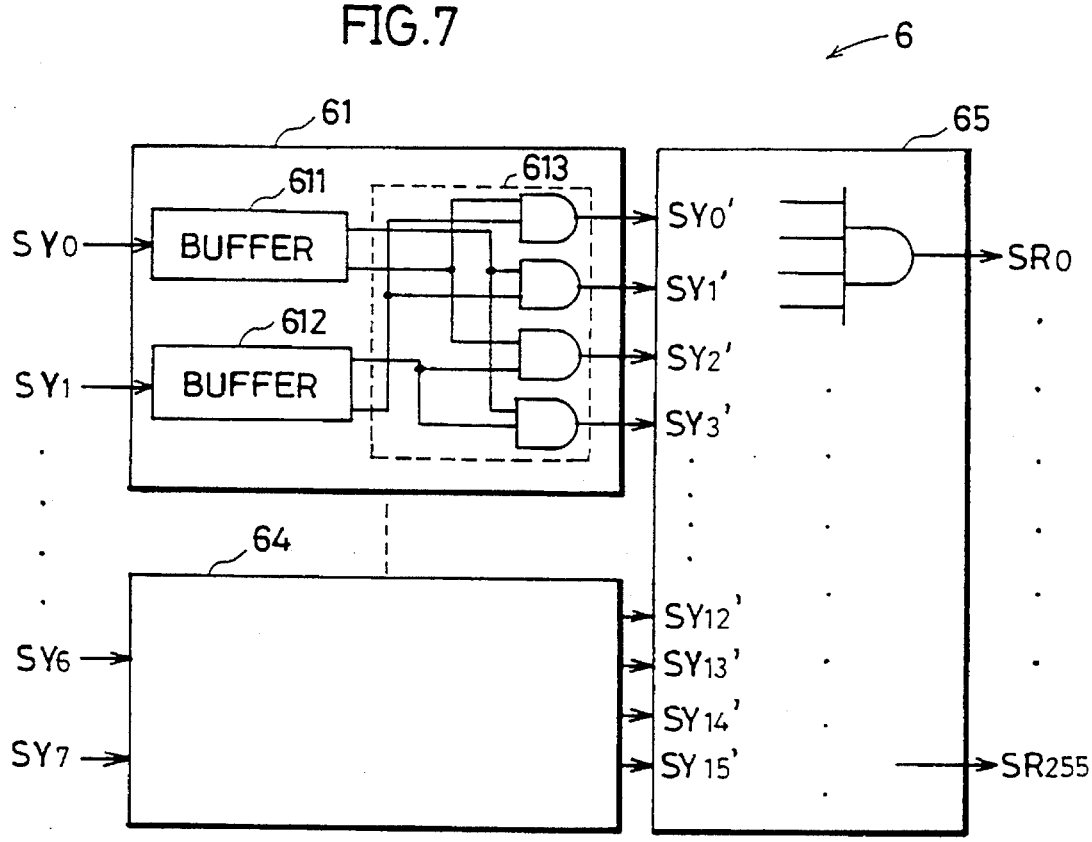
FIG. 7 is a schematic diagram of a serial decoder shown in FIG. 1.

FIG. 7 is a schematic diagram of the serial decoder 6 shown in FIG. 1. Referring to FIG. 7, the serial decoder 6 comprises preceding stage circuits 61 to 64 each connected to receive two bits of the internal address signals SY0 to SY7, and a succeeding stage circuit responsive to the output signal from the circuits 61 to 64 to generate serial register selecting signals SR0 to SR255. One preceding stage circuit 61 comprises buffers 611 and 612 and an AND gate circuit 613. One preceding stage circuit 61 is responsive to the two bits SY0 and SY1 of the internal address signal to provide the signals SY0' to SY3'. Accordingly, the signal SY0' to SY15' are applied by the circuits 61 to 64 to the succeeding stage circuit 65. The succeeding stage circuit 65 is responsive to the applied signal SY0' to SY15' to generate serial register selecting signals SR0 to SR255 for selecting in succession 256 registers provided in the serial register 4. The generated serial register selecting signals SR0 to SR255 are applied to the serial register 4.

Figure 8:
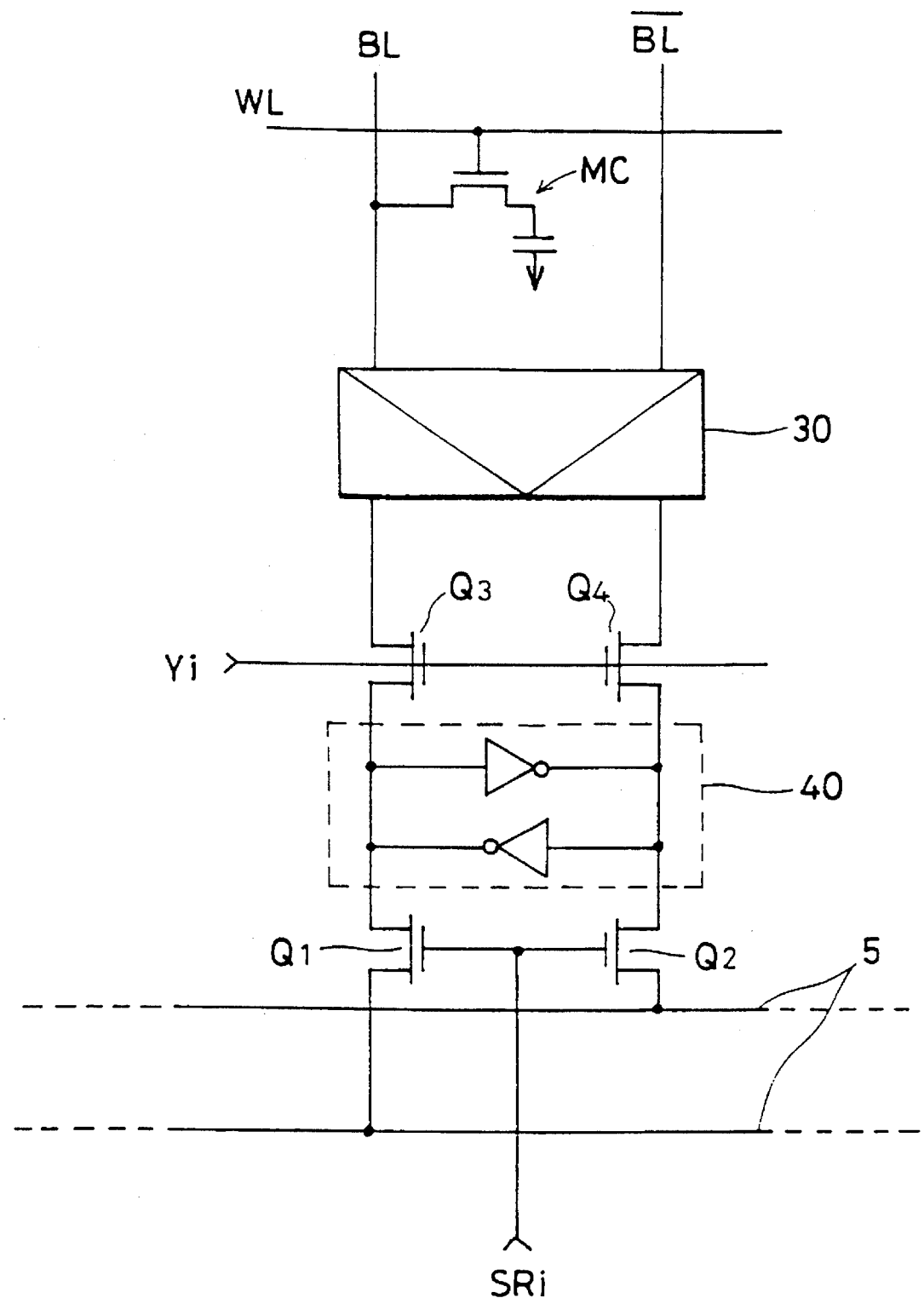
FIG. 8 is a schematic diagram of a sense amplifier, serial register and a serial bus line shown in FIG. 1.

FIG. 8 is a schematic diagram of portions of the sense amplifying 3, the serial register 4 and the serial bus line 5 shown in FIG. 1. FIG. 8 shows only a circuit selected by one serial register selecting signal SRi generated by the serial decoder 6. Referring to FIG. 8, the register 40 for holding the serial data is connected to a sense amplifier 30 through MOS transistors Q3 and Q4 constituting the Y gate circuit. In addition, the register 40 is connected to the serial bus line 5 through NMOS transistors Q1 and Q2.

In operation, the signal stored in the memory cell is provided to the bit line BL in response to the high level signal of the word line WL. The sense amplifier 30 amplifies a very small voltage difference arising between the bit line pair BL, $\overline{BL}$. The column decoder 14 shown in FIG. 1 provides the column selecting signal Yi and the transistors Q and Q4 are responsive to the signal Yi to be turned on. Accordingly, the data signal amplified by the sense amplifier 30 is held in the register 40. The transistors Q1 and Q2 are responsive to the serial register selecting signal SRi generated by the serial decoder 6 to be turned on and the data signal held by the register 40 is applied to the serial bus line 5. The data signal held in the respective register 40 provided in the serial register 4 are applied in succession to the serial bus line 5 in response to the selecting signals SR0 to SR255 and thus the serial output data SD0 is obtained at a high speed.

In case the counter 7 and the mode decoder 8 shown in FIG. 4 are utilized in the video RAM 1 shown In FIG. 1, it is possible to externally select "2", "4", "8", "16", ... as an address interval m. On the other hand, in case other address intervals, for example, "3", "5", "7", ... is required, the circuit shown in FIG. 9A is utilized.

Figure 9A:
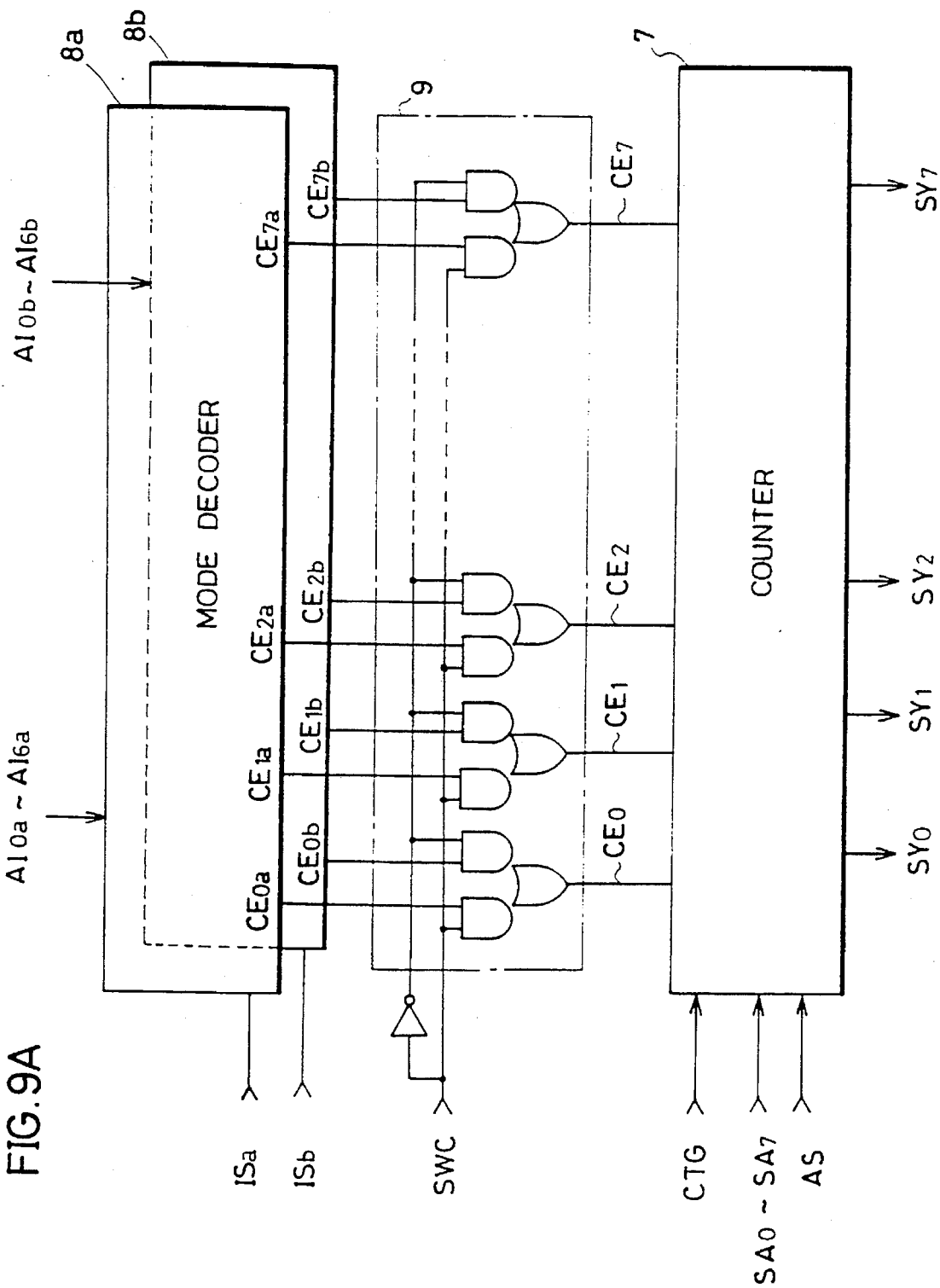
FIG. 9A is a circuit diagram of mode decoders and a switching circuit for obtaining an optional address interval.

Referring to FIG. 9A, two mode decoders 8a and 8b are connected to the counter 7 through a switching circuit 9. The mode decoders 8a, 8b and the counter 7 have the same circuit configuration as the one in the circuit shown in FIG. 4. The mode decoder 8a responds to an interval setting signal ISa, and receives externally applied first address interval data AI0a to AI6a. The mode decoder 8b also responds to a signal ISb, and receives externally applied second address interval data AI0b to AI6b. The mode decoders 8a and 8b respond to the applied data AI0a to AI6a and AI0b to AI6b, and apply signals CE0a to CE7a and CE0b to CE7b to the switching circuit 9. The switching circuit 9 responds to a switching control signal SWC and apply the signals CE0a to CE7a and CE0b to CE7b alternately as signals CE0 to CE7 to the counter 7.

Figure 9B:
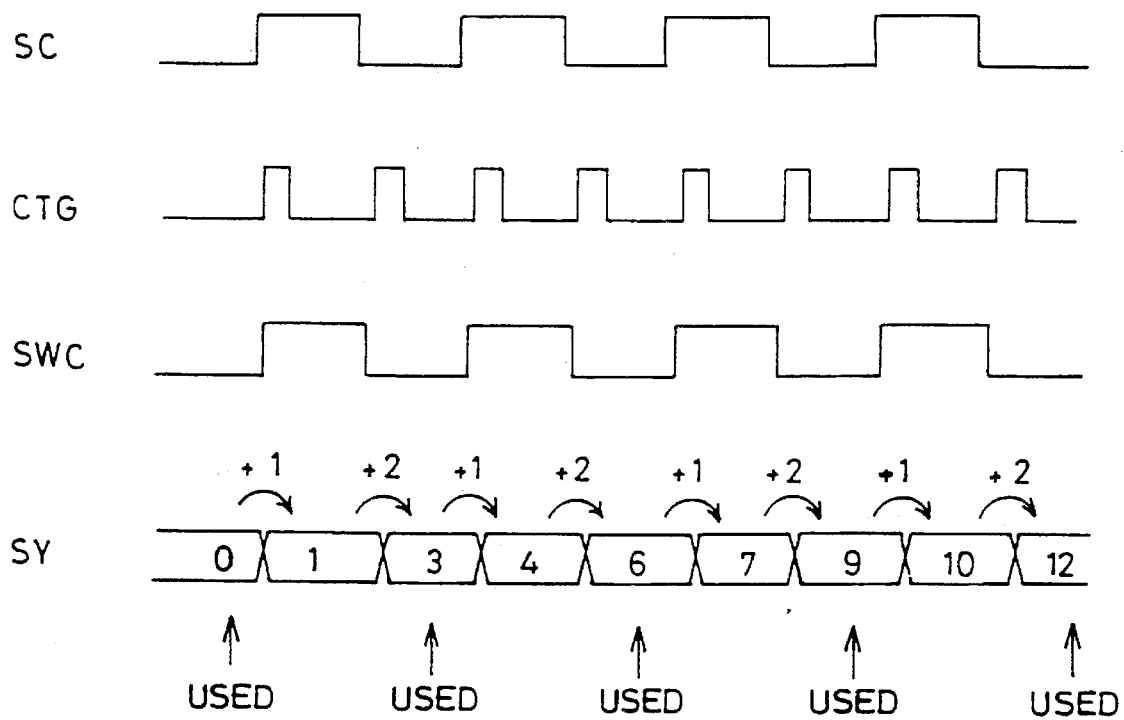
FIG. 9B is a timing diagram for describing the operation of the circuit shown in FIG. 9A.
Figure 10A:
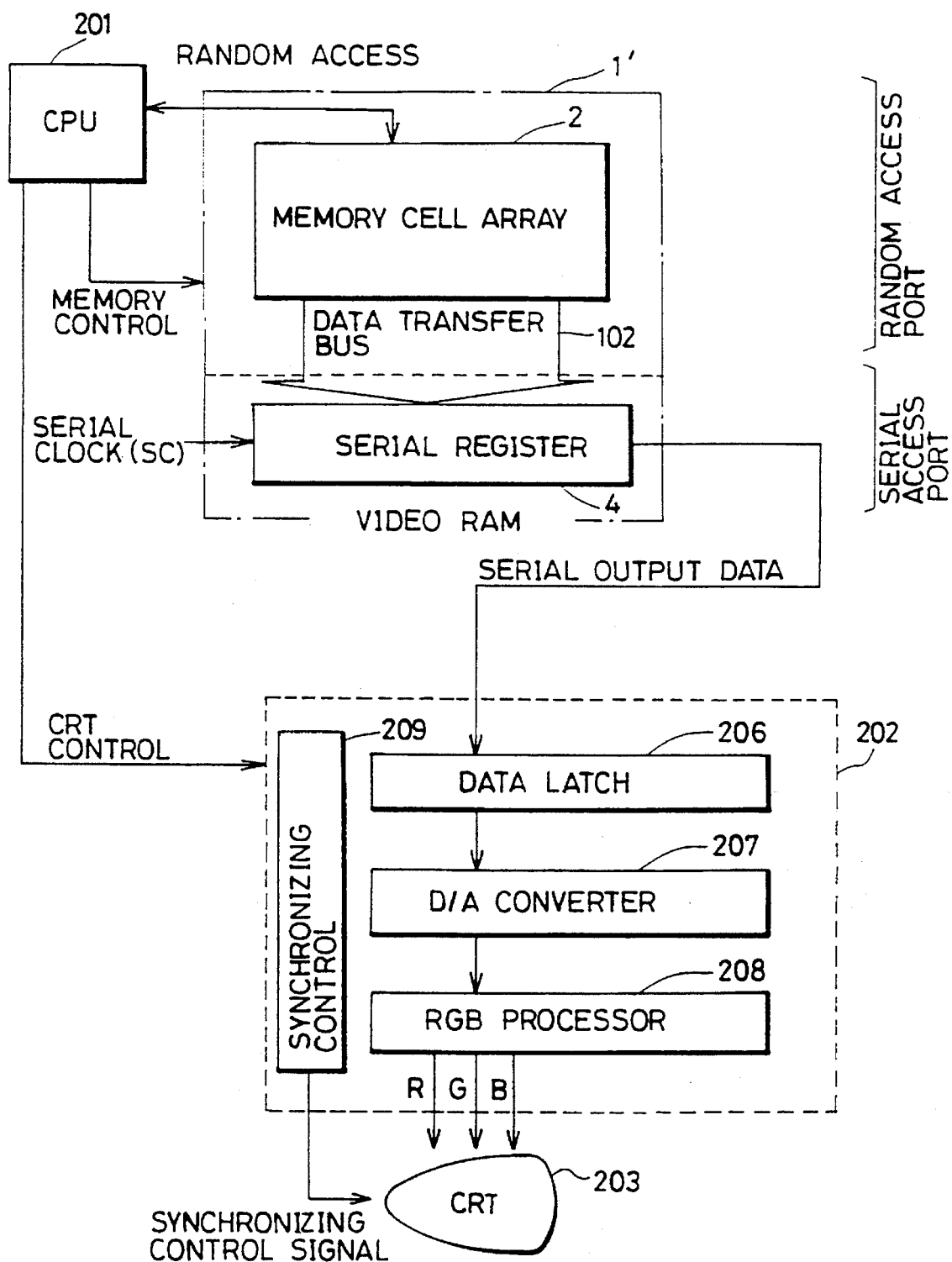
FIG. 10A is a block diagram showing an outline of the video RAM.
Figure 10B:
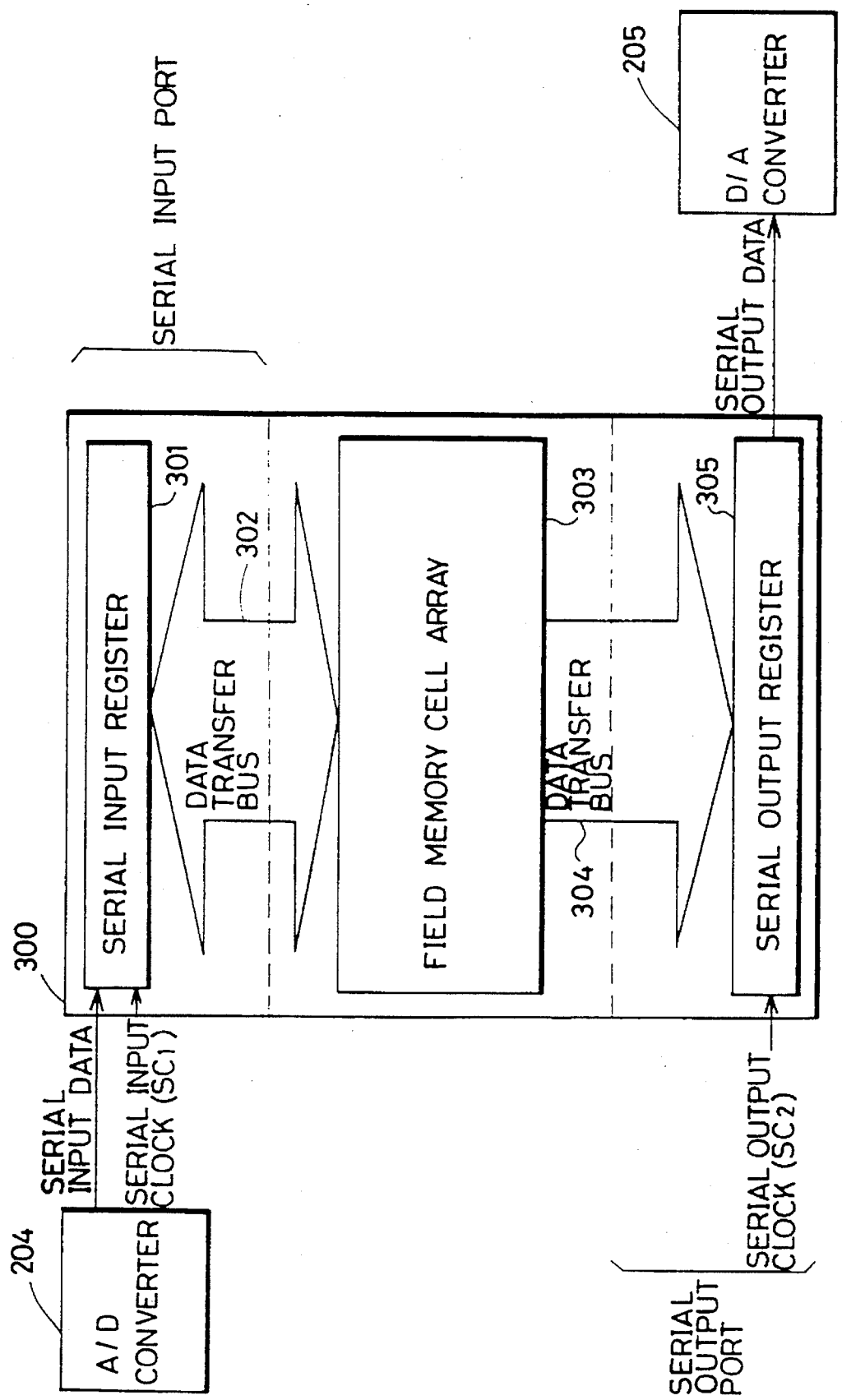
FIG. 10B is a block diagram showing an outline of a field memory.

Referring to the timing diagram shown in FIG. 9B, the switching control signal SWC and a counter trigger signal CTG are generated from the clock signal generating circuit 16 shown in FIG. 1, in response to an externally applied serial clock signal SC. The counter 7 performs count operation based on the signals CE0 to CE7, in response to the counter trigger signal CTG. For example, in case "3" is required as an address interval m, address interval data AIa and AIb represented by the following equation is applied externally.

(AI0a, AI1a, AI2a, AI3a, AI4a, AI5a, AI6a)=(0, 0, 0, 0, 0, 0, 0) (2)

(AI0b, AI1b, AI2b, AI3b, AI4b, AI5b, AI6b)=(0, 1, 0, 0, 0, 0, 0) (3)

Since the counter trigger signal CTG having a frequency twice as high as that of the serial clock signal SC, in one cycle of the serial clock signal SC the least counter unit 700 and the counter unit 701 one bit higher than that in the counter 7 are counted up. That is, internal address signals SY0 to SY7 which increase in the interval "3" (="1"+"2") are obtained.

In other cases, for example, in which each of "5", "9", "6" is required for example, address interval data AIa and AIb represented by the following equations are externally applied.

(AI0a, AI1a, AI2a, AI3a, AI4a, AI5a, AI6a)=(0, 0, 0, 0, 0, 0, 0) (4)

(AI0b, AI1b, AI2b, AI3b, AI4b, AI5b, AI6b)=(0, 0, 1, 0, 0, 0, 0) (5)

Internal address signals SY0 to SY7 which increase in the interval "5" (="1"+"4") are thus obtained.

(AI0a, AI1a, AI2a, AI3a, AI4a, AI5a, AI6a)=(0, 0, 0, 0, 0, 0, 0) (6)

(AI0b, AI1b, AI2b, AI3b, AI4b, AI5b, AI6b)=(0, 0, 0, 0, 0, 0, 0) (7)

Internal address signals SY0 to SY7 which increase in the interval "9" (="1"+"8") are thus obtained.

(AI0a, AI1a, AI2a, AI3a, AI4a, AI5a, AI6a)=(0, 1, 0, 0, 0, 0, 0) (8)

(AI0b, AI1b, AI2b, AI3b, AI4b, AI5b, AI6b)=(0, 0, 1, 0, 0, 0, 0) (9)

Internal address signals SY0 to SY7 which increase in the interval "6" (="2"+"4") are therefore obtained.

It is pointed out that, as mentioned above, by changing the combination of the externally applied address interval data AIa and AIb depending upon the necessity, an optional address interval m is obtained.

As described in the foregoing, in the video RAM 1 shown in FIG. 1 the mode decoder 8 decodes the externally provided interval data AI. The counter 7 is responsive to the decoded signal to generate the address values ADy, ADy+m, ADy+2m, . . . having the interval of the count value m as the internal address signals SY0 to SY7. The data held in the serial register 4 is selectively read in response to the signals SY0 to SY7. More specifically, only the required data signal is selectively read from the video RAM and, therefore, a period of time necessary for reading is shortened. In other words, it is pointed out that desired data signal stored in the video RAM can be serially outputted at a high speed.

Meanwhile, in the foregoing description an example of a video RAM was described; however, it is pointed out that the present invention can be generally applied to a semiconductor memory device capable of serially outputting a data signal. More specifically, the present invention can be applied to such field memory device as described previously, for example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device capable of serially outputting data to an output terminal, comprising:

a memory cell array including a plurality of memory cells arranged in rows and columns for storing a plurality of data, a clock signal generating means for generating a plurality of different clock pulses, serial register means for storing one row of data of said memory cell array in response to a first external address signal applied to said memory cell array, selector means responsive to an externally provided interval designating signal and a second external address signal for providing a selector signal designating a monotonic interval of first clock pulses, address generating means responsive to the monotonic interval of first clock pulses designated by said selector means and a second clock pulse for generating a series of internal address signals, said series of internal address signals including non-successive addresses of the stored one row of data, and reading and outputting means responsive to the internal address signals generated by said address generating means for reading data from said serial register means and serially outputting said read data.

2. A semiconductor memory device in accordance with claim 1, wherein said address generating means comprises counter means for counting the applied clock signal for generating said internal address signal.

3. A semiconductor memory device in accordance with claim 2, wherein said counter means comprises a plurality of cascaded count elements for counting the applied clock signal, said plurality of count elements provides, as said internal address signal, a signal having a plurality of bits, and said selector means comprises effective count element determining means responsive to the applied interval designating signal for determining effective count elements out of said plurality of count elements.

4. A semiconductor memory device in accordance with claim 3, wherein said effective count element determining means comprises means responsive to the applied interval designating signal for determining the count element which generates the least significant bit of the internal address signal out of said plurality of count elements.

5. A semiconductor memory device in accordance with claim 3, wherein said reading and outputting means comprises row designating means responsive to an externally provided row address signal for designating a row of the memory cells in said memory cell array, sense amplifying means coupled to said memory cell array for amplifying the data signal stored in the row of the memory cells designated by said row designating means, and, data holding means coupled to said sense amplifying means for holding the data signal amplified by said sense amplifying means, said holding means being responsive to the signal provided from said plurality of count elements to serially output the held signal.

6. A semiconductor memory device in accordance with claim 1, wherein said reading and outputting means comprises row designating means responsive to an externally provided row address signal for designating a row of the memory cells in said memory cell array, sense amplifying means coupled to said memory cell array for amplifying the data signal stored in the row of the memory cells designated by said row designating means, and data holding means coupled to said sense amplifying means for holding the data signal amplified by said sense amplifying means, said data holding means being responsive to the internal address signal generated by said address generating means to serially output the held data signal.

7. A semiconductor memory device in accordance with claim 1, wherein said semiconductor memory device comprises a video random access memory device.

8. A semiconductor memory device in accordance with claim 1, wherein said semiconductor memory device comprises a field memory device.

9. A method for operating a semiconductor memory device capable of serially outputting a stored data signal, said semiconductor memory device comprising:

a memory cell array including a plurality of memory cells arranged in rows and columns for storing the data signal, address generating means responsive to an externally provided clock signal for generating an internal address signal for designating in succession a monotonic series of memory cells, including non-successive memory cells, provided in a given row, and read means responsive to the internal address signal generated by said address generating means for reading and outputting the data signal stored in the designated memory cells, said method comprising the steps of:

storing a row of data of said memory cell array, in response to an external address signal, receiving an externally provided interval designating signal for designating an interval of the address values generated by said address generating means, in response to the provided interval designating signal, controlling the interval of the address values generated by said address generating means, and in response to the interval controlled address signal, reading, at the designated address value interval, the data signal stored in said row of the memory cells in said memory cell array.

10. A semiconductor memory device capable of serially outputting a stored data signal, comprising:

a memory cell array including a plurality of memory cells arranged in rows and columns for storing the data signal, means for storing one row of data of said memory cell array, address generating means responsive to an externally provided clock signal for generating a series of internal address signals, said series of internal address signals including non-successive addresses of the stored one row of data, a serial data bus, and reading means responsive to the internal address signals generated by said address generating means for reading the data from said means for storing and transferring the data signal to said serial data bus.

11. A method for operating a semiconductor memory device capable of serially supplying a stored data signal to a serial output bus, the device comprising a memory cell array including a plurality of memory cells arranged in rows and columns for storing data, a clock signal generating means for generating first and second clock signals, and a serial register for storing one row of data of said memory cell array, the method comprising the steps of:

storing one row of data of said memory cell array in a plurality of serial addresses of serial register in response to an external address signal, designating a monotonic interval of first clock signals in response to an externally provided interval designating signal and an external address interval signal, generating a series of internal address signals in response to a monotonic interval of first clock signals and the second clock signal, said series of address signals including non-successive addresses of the stored one row of data, and reading and outputting data from said serial register means and outputting said read data to the serial bus in response to the internal address signals.

12. The method in accordance with claim 11, wherein said step of internal address signal generating includes the step of generating internal address signals separated from each other by an interval greater than unity.

13. The method in accordance with claim 12, including the step of changing said interval between rows of said array.

14. A semiconductor memory device capable of serially outputting data to an output terminal, comprising:

a memory cell array including a plurality of memory cells arranged in rows and columns for storing a plurality of data, a clock signal generating means for generating a plurality of different clock pulses, serial register means for storing one row of data of said memory cell array in response to a first external address signal applied to said memory cell array, selector means responsive to an externally provided interval designating signal for providing a selector signal designating a monotonic interval of x first clock pulses, address generating means responsive to the monotonic interval of first clock pulses designated by said selector means and a second clock pulse for generating internal address signals, and reading and outputting means responsive to the internal address signals generated by said address generating means for reading data from said serial register means and serially outputting said read data, said reading and outputting means including address selecting means for selecting the addresses of the data read from said serial register means, wherein when x=1, all the addresses in the serial register are selected to be read beginning with the address designated by the second external address signal, and when x>1, the addresses in the serial register selected to be read begin with an address defined by a sum of a least significant bit and x and then every additional x-th address thereafter.

15. A semiconductor memory device capable of serially outputting data to an output terminal, comprising:

a memory cell array including a plurality of memory cells arranged in rows and columns for storing a plurality of data, serial register means for holding one row of data of said memory cell array and having a plurality of holding portions provided corresponding to a plurality of columns, each holding portion temporarily storing the information stored in the memory cells in a corresponding column in a selected row, and means receiving a clock signal and a mode setting signal for counting clock signals in response to an interval based on the mode selecting signal to generate a series of internal address signals including non-successive addresses of the held one row of data, wherein one of said plurality of holding portions of said serial register is selected in accordance with each generated internal address to provide the data temporarily stored in the selected holding portion to the serial data output.

16. A semiconductor memory device capable of serially outputting data to an output terminal, comprising:

a memory cell array including a plurality of memory cells arranged in rows and columns for storing a plurality of data, serial register means for holding one row of data of said memory cell array and having a plurality of holding portions provided corresponding to a plurality of columns, each holding portion temporarily storing the information stored in the memory cells in a corresponding column in a selected row, a plurality of switching elements provided corresponding to the plurality of holding portions of said serial register, each connected between output nodes of a corresponding plurality of holding portions and a serial data output, and means receiving a clock signal and a mode setting signal for counting clock signals in response to an interval based on the mode selecting signal to generate a series of internal address signals including non-successive addresses of the held one row of data, wherein one of said plurality of switching elements is rendered conductive in accordance with each internal address signal.

* * * * *